United States Patent
Su et al.

(10) Patent No.: US 7,727,878 B2
(45) Date of Patent: Jun. 1, 2010

(54) METHOD FOR FORMING PASSIVATION LAYER

(75) Inventors: Cheng-Hsueh Su, Gangshan Town, Kaohsiung County (TW); Hsing-Fu Lu, Kaohsiung (TW); Tsung-Chieh Ho, Kaohsiung (TW); Shyh-Ing Wu, Kaohsiung County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 721 days.

(21) Appl. No.: 11/617,157

(22) Filed: Dec. 28, 2006

(65) Prior Publication Data
US 2007/0232052 A1 Oct. 4, 2007

(30) Foreign Application Priority Data
Mar. 29, 2006 (TW) .............................. 95111057 A

(51) Int. Cl.
*H01L 21/4763* (2006.01)
(52) U.S. Cl. .................. 438/619; 438/421; 438/422; 257/E21.13; 257/E21.564
(58) Field of Classification Search ................. 438/612, 438/421–422, 619; 257/E21.13, E21.564
See application file for complete search history.

(56) References Cited

U.S. PATENT DOCUMENTS 6,287,950 B1  9/2001  Wu et al.
6,846,719 B2  1/2005  Tong et al.
2007/0077511 A1*  4/2007  Tredwell et al. ............ 430/201
2007/0184654 A1*  8/2007  Akram et al. ................ 438/675

FOREIGN PATENT DOCUMENTS

TW  529118  4/2003
TW  222710  10/2004
TW  229436  11/2005

OTHER PUBLICATIONS

English language translation of abstract of TW 229436.
English language translation of abstract of TW 222710.
English language translation of abstract of TW 529118.

* cited by examiner

*Primary Examiner*—Thanh Nguyen
(74) *Attorney, Agent, or Firm*—Thomas, Kayden, Horstemeyer & Risley

(57) ABSTRACT

A method for forming a passivation layer is disclosed. In the method, a substrate containing a top surface and a bottom surface opposite to the top surface is first provided, wherein a plurality of conductive pads are disposed on the top surface thereof. Thereafter, a first passivation layer is formed on the top surface of the substrate, wherein the first passivation layer has a characteristic of photoresist. A first exposure/develop step is then performed to form a plurality of first openings in the first passivation layer, wherein the conductive pads are exposed through the first openings. Then, a second passivation layer is formed on the first passivation layer, wherein the second passivation layer has a characteristic of photoresist. A second exposure/develop step is then performed to form a plurality of second openings in the second passivation layer, wherein the conductive pads are exposed through the second openings.

16 Claims, 5 Drawing Sheets

METHOD FOR FORMING PASSIVATION LAYER

RELATED APPLICATIONS

The present application is based on, and claims priority from, Taiwan Application Serial Number 95111057, filed Mar. 29, 2006, the disclosure of which is hereby incorporated by reference herein in its entirety.

FIELD OF THE INVENTION

The present invention relates to a method for forming a passivation layer, and more particularly, to a method for forming a passivation layer with the capability of reducing voids.

BACKGROUND OF THE INVENTION

With the development of semiconductor technology, the requirements for packaging integrated circuits have becoming stricter. Currently, most of the high pin-count chips (such as graphic chips and chip sets, etc.) are packaged by a BGA (Ball Grid Array) technique, wherein the BGA technique can be divided into five categories including a PBGA (Plastic BGA) substrate, a CBGA (Ceramic BGA) substrate, a FCBGA (FlipChip BGA) substrate, a TBGA (Tape BGA) substrate, and a CDPBGA (Carity Down PBGA) substrate. The FCBGA technique is to dispose Au or solder bumps on an IC chip for soldering to a printed wiring board (PWB).

For example, referring to FIG. 1, FIG. 1 is a schematic cross-sectional view showing the structure of a conventional solder bump prepared by a film electro-deposition process. Such as shown in FIG. 1, a silicon wafer 100 includes a conductive pad 12, a passivation layer 110, a conductive layer 180 and a solder ball 190. The conductive pad 102, such as an aluminum pad or a copper pad, is used for forming an electrical connection to an external circuit (not shown). The passivation layer 110 is used for providing a semiconductor structure with protection and a planarization surface, wherein the passivation layer 110 allows the surface 102a of the conductive pad 102 to be exposed. The conductive layer 10, such as a UBM (Under Bump Metallurgy Layer) layer formed by sputtering, covers a portion of the passivation layer 110 and the surface 102a of the conductive pad 102. The UBM layer is typically composed of an adhering/diffusion barrier layer 160 and a wetting layer 170, for increasing the adhesion between the solder ball 190 and the conductive pad 102.

Referring to FIG. 2A to FIG. 2D, FIG. 2A to FIG. 2D are schematic cross-sectional views showing the process for making the passivation layer 110 shown in FIG. 1. At first, such as shown in FIG. 2A, a silicon wafer 100 is provided, wherein the silicon wafer 110 has a plurality of conductive pads 102 formed thereon. Then, such as shown in FIG. 2B, a passivation layer 110 is coated on the silicon wafer 100 so as to cover the conductive pads 102, wherein the passivation layer 110 is made of polyimide, and the thickness thereof is about 10 μm. Thereafter, such as shown in FIG. 2C, an exposure/develop step is performed to form a plurality of openings 112 on the passivation layer 110 for exposing the conductive pads 102. Then, such as shown in FIG. 2D, a baking step is performed for curing the passivation layer 110. In the conventional skill, since the passivation layer 110 is formed by only one costing step and covers the entire surface of the silicon wafer 100, a particle 104 (shown in FIG. 2A) if existing on the silicon wafer 100 will easily result in a void 114 (shown in FIG. 2D) formed on the surface of the final passivation layer 110, wherein the existence of the void 114 will easily cause customer complaints and lower the product yield.

SUMMARY OF THE INVENTION

Therefore, an improved method for forming a passivation layer is desired to solve the problems of the voids caused by the particles formed on the passivation layer in the conventional process, thereby promoting the product quality and process yield.

One aspect of the present invention is to provide a method for filling up the voids formed on the passivation by applying the steps of passivation-layer coating and exposure/develop twice, thereby overcoming the problems of the voids caused by the particles remaining on the substrate.

According to a preferred embodiment of the present invention, the method for forming a passivation layer comprises providing a substrate, wherein the substrate has a top surface and a bottom surface opposite to the top surface, and the top surface has a plurality of conductive pads; forming a first passivation layer on the top surface; performing a first exposure/develop step to form a plurality of first openings in the first passivation layer, wherein the conductive pads are exposed through the first openings; forming a second passivation layer on the first passivation layer, the ratio of the thickness of the first passivation layer and the thickness of the second passivation layer is substantially at least two; and performing a second exposure/develop step to form a plurality of second openings in the second passivation layer, wherein the conductive pads are exposed through the second openings.

With the application of the aforementioned method for forming a passivation layer, two coating steps for forming the passivation layer are used to replace the original single coating step for forming the same, so that it can be assured that the passivation layer formed by the first coating step does not have any void existing after the second coating step is performed, thus avoiding customer complaints and lowered product yield caused by the overlarge voids remaining in the passivation layer. Therefore, with comparison to other conventional processes, the process disclosed in the present invention not only can resolve the problems of poor passivation layer quality and lowered product yield, but also can greatly save fabrication time and cost.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1:
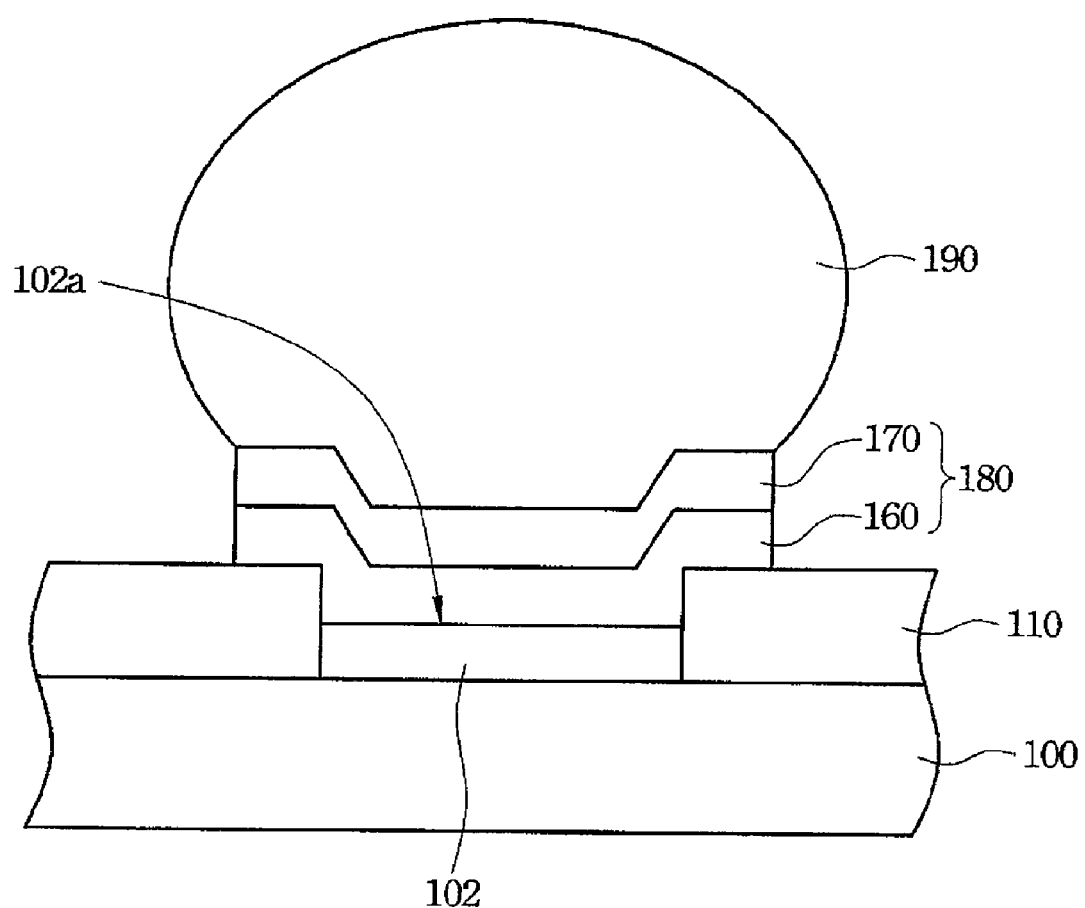
FIG. 1 is a schematic cross-sectional view showing the structure of a conventional solder bump prepared by a film electro-deposition process.
Figure 2A:
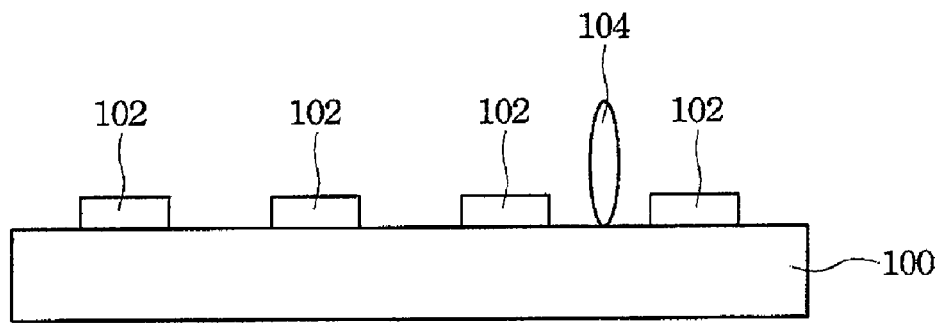
FIG. 2A to FIG. 2D are schematic cross-sectional views showing the process for making the passivation layer shown in FIG. 1.
Figure 2B:
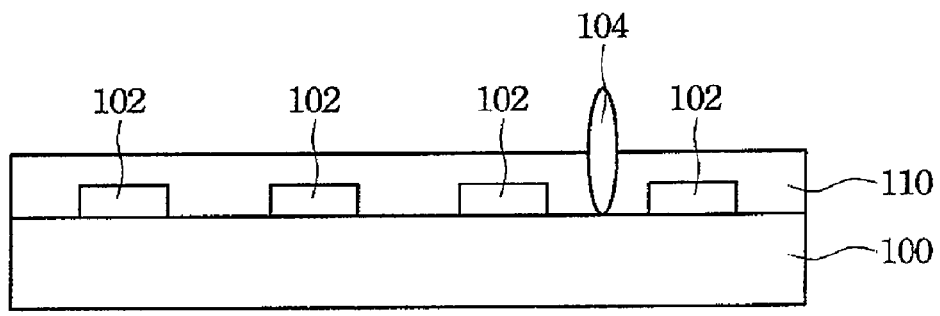
Figure 2C:
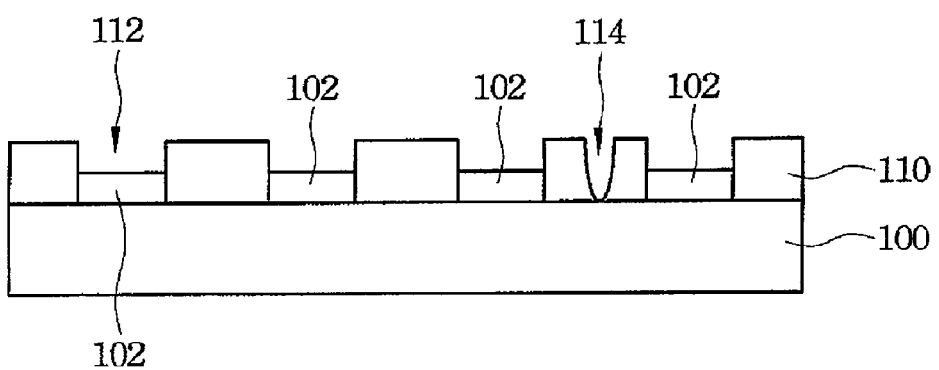
Figure 2D:
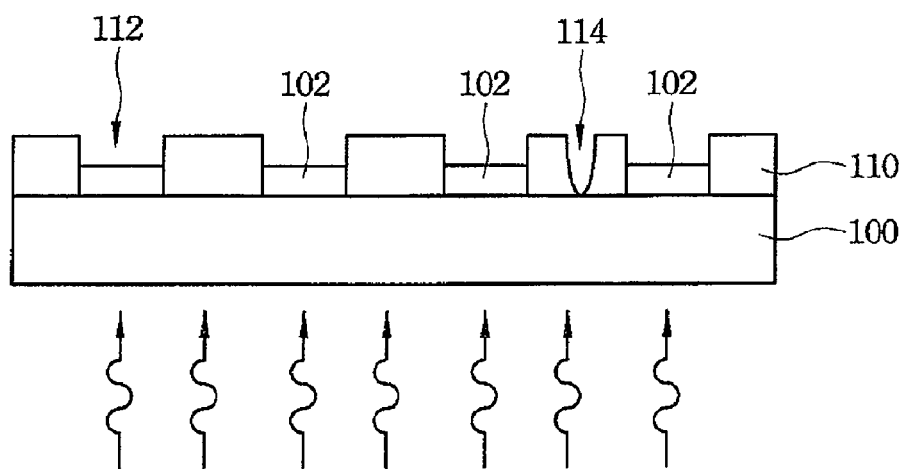
Figure 3A:
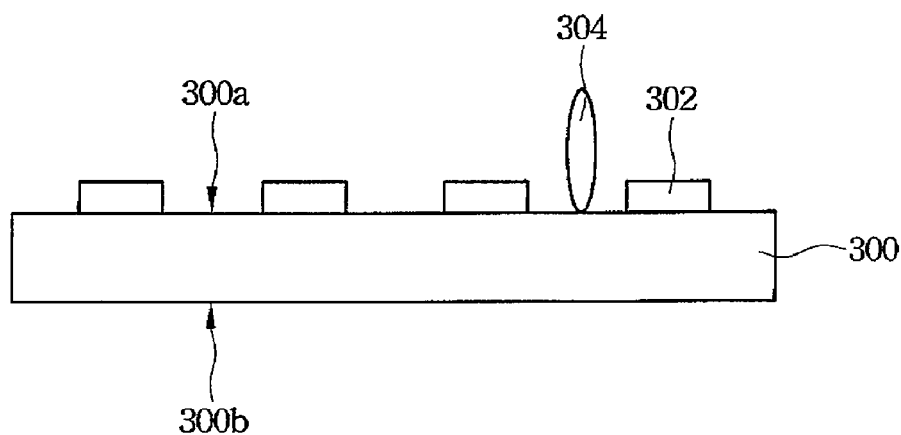
FIG. 3A to FIG. 3F are schematic cross-sectional views showing the process for making a passivation layer according to a preferred embodiment of the present invention.
Figure 3B:
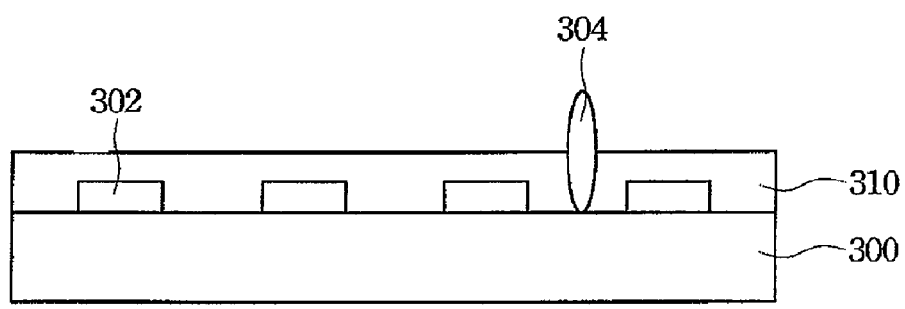
Figure 3C:
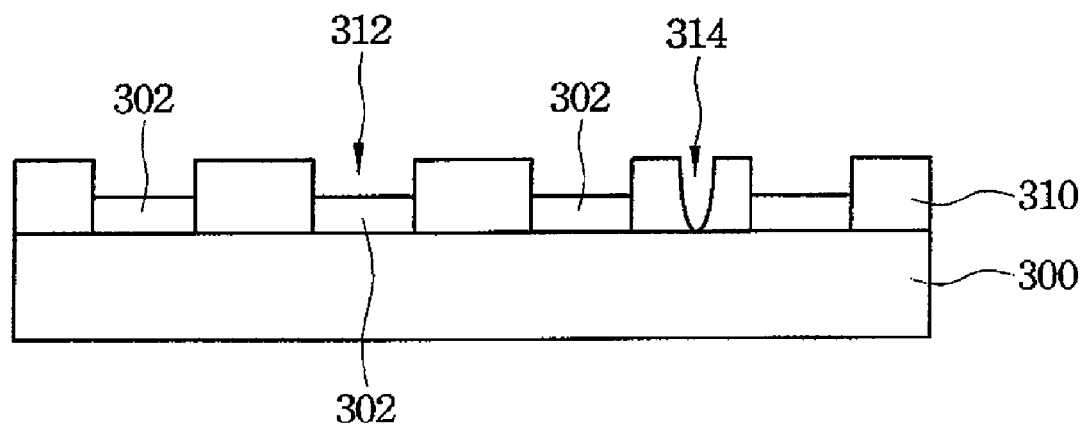
Figure 3D:
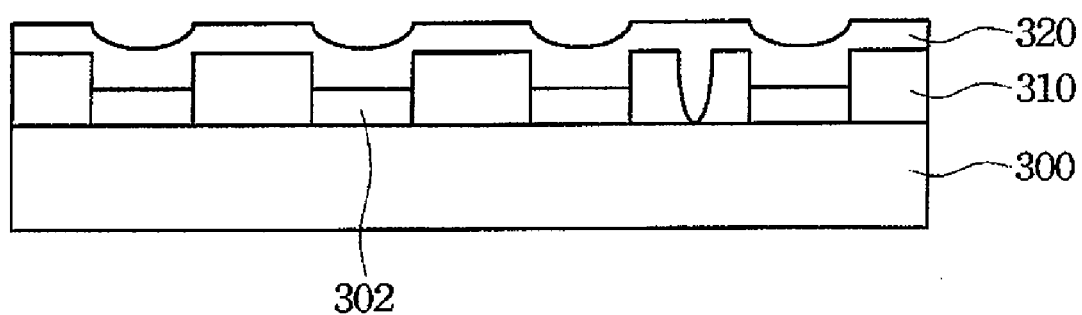
Figure 3E:
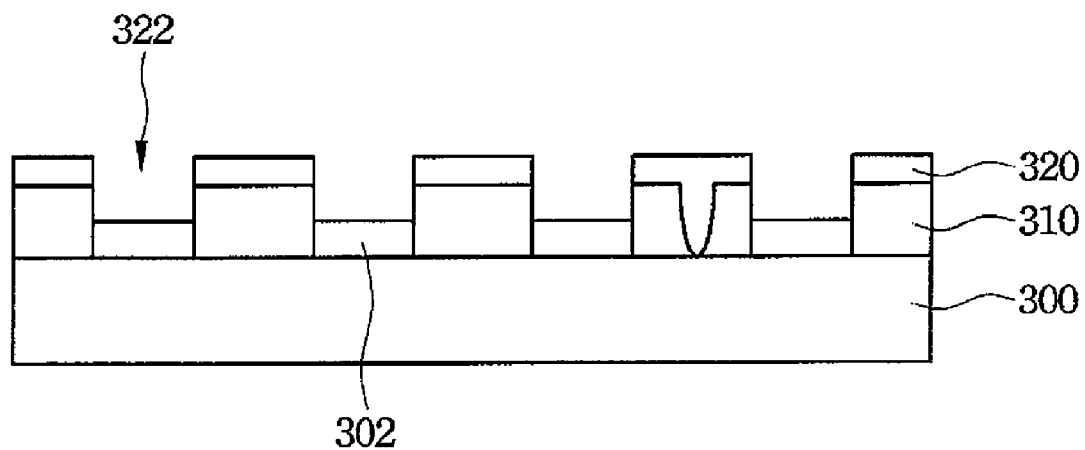
Figure 3F:
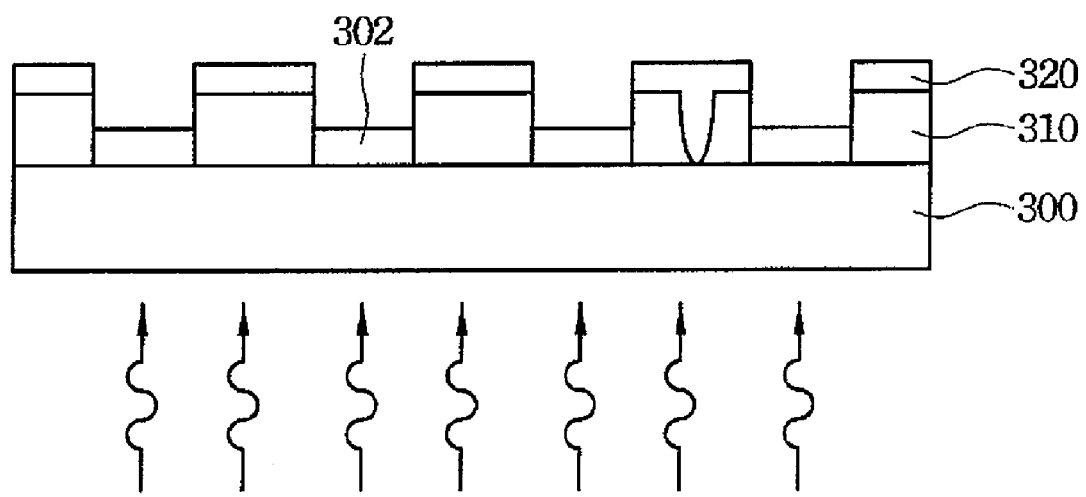

Referring to FIG. 3A to FIG. 3F, FIG. 3A to FIG. 3F are schematic cross-sectional views showing the process for making a passivation layer according to a preferred embodiment of the present invention. At first, such as shown in FIG. 3A, a substrate 300 is provided. In the present embodiment, the substrate is a wafer having a top surface 300a and a bottom surface 300b opposite to the top surface 300a, wherein there are a plurality of conductive pads 302 disposed on the top surface 300a. At this point, since the substrate 300 has not been cleaned up, there is at least a particle 304 remaining on the top surface 300a. Thereafter, such as shown in FIG. 3B, a first passivation layer 310 is formed on top of the top surface 300a to cover the conductive pads 302. In the present embodiment, the first passivation layer 310 is made of polyimide, which has a characteristic of negative photoresist, so that the unexposed portion of the first passivation layer 310 will be removed via a develop step, and the other exposed portion thereof will remain. However, the present invention is not limited thereto, and the material having a characteristic of positive photoresist also can be used to form the first passivation layer 310. At this point, if there is a particle 403 remaining on the top surface 300a, at least one void 314 (shown in FIG. 3C) will be formed in a portion of the first passivation layer 310 to expose the substrate 300 in the subsequent exposure/develop step. In the present embodiment, the thickness of the first passivation layer 310 is about 8 μm. Then, such as shown in FIG. 3C, a first exposure/develop step is performed to form a plurality of first openings 312 on the first passivation layer 310 for exposing the conductive pads 302. Meanwhile, the remaining particle 304 results in the void 314 formed on the first passivation layer 310. Thereafter, such as shown in FIG. 3D, a second passivation layer 320 is formed on top of the first passivation layer 310 to cover the conductive pads. In the present embodiment, the second passivation layer 320 is made of polyimide, which has a characteristic of negative photoresist, so that the unexposed portion of the second passivation layer 320 will be removed via a develop step, and the other exposed portion thereof will remain. However, the present invention is not limited thereto, and the material having a characteristic of positive photoresist also can be used to form the second passivation layer 320. If there is a void 314 existing on the first passivation layer 310, the void 314 is filled up with the second passivation layer 320 at this point. Further, in the present embodiment, the thickness of the second passivation layer 320 is about 2 μm. It is worthy to be noted that the ratio of the thickness of the first passivation layer 310 and the thickness of the second passivation layer 320 is substantially at least two. Such that, the void 314 formed on the first passivation layer 310 can be filled up with the second passivation layer 310 subsequently coated, and if there are still other particles remaining on the second passivation layer 320, those particles will not result in large voids since the second passivation layer 320 is thinner. Thereafter, such as shown in FIG. 3E, a second exposure/develop step is performed to form a plurality of second openings 322 on the second passivation layer 320 for exposing the conductive pads 302. Then, a baking step is performed for curing the first passivation layer 310 and the second passivation layer 320.

In brief, the method of the present invention for forming a passivation layer is featured in dividing the single coating step for forming the original passivation layer into two coating steps for forming the novel passivation layer having the same thickness as the original passivation layer. The method of the present invention can assure that the passivation layer formed by the first coating step does not have any void existing after the second coating step is performed, thus avoiding customer complaints and lowered product yield caused by the overlarge voids remaining in the passivation layer. Therefore, with comparison to other conventional processes, the process disclosed in the present invention can substantially prevent voids from forming on the passivation layer, so that the product quality and process yield can be greatly promoted.

According to the aforementioned preferred embodiments of the present invention, one advantage of applying the method of the present invention for forming a passivation layer is that the original single coating step for forming the passivation layer is replaced with two coating steps by using the same process equipment, such that no voids or voids smaller than the client standard will be formed on the passivation layer of the same thickness, thus preventing the problem of lowering process yield from occurring. Hence, the present invention not only resolves the void problem occurring in the conventional process, but also greatly promotes the quality and process yield of the passivation layer, and further save fabrication time and cost.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a passivation layer, comprising:
   providing a substrate having a top surface and a bottom surface opposite to the top surface, the top surface having a plurality of conductive pads;
   forming a first passivation layer on the top surface;
   performing a first exposure/develop step to form a plurality of first openings in the first passivation layer, wherein the conductive pads are exposed through the first openings, wherein at least one void is formed in a portion of the first passivation layer to expose the substrate in the first exposure/develop step;
   forming a second passivation layer on the first passivation layer; and
   performing a second exposure/develop step to form a plurality of second openings in the second passivation layer, wherein the conductive pads are exposed through the second openings.

2. The method of claim 1, further comprising:
   performing a baking step for curing the first passivation layer and the second passivation layer.

3. The method of claim 1, wherein the first passivation layer is a negative photoresist.

4. The method of claim 1, wherein the first passivation layer is a positive photoresist.

5. The method of claim 1, wherein the second passivation layer is a negative photoresist.

6. The method of claim 1, wherein the second passivation layer is a positive photoresist.

7. The method of claim 1, wherein the ratio of the thickness of the first passivation layer and the thickness of the second passivation layer is substantially at least two.

8. The method of claim 1, wherein the substrate is a wafer.

9. The method of claim 1, wherein the first passivation layer is made of polyimide.

10. The method of claim 1, wherein the second passivation layer is made of polyimide.

11. The method of claim 1, wherein the thickness of the first passivation layer is 8 μm.

12. The method of claim 1, wherein the thickness of the second passivation layer is 2 μm.

13. The method of claim 1, wherein the first passivation layer is formed by spin coating.

14. The method of claim 1, wherein the second passivation layer is formed by spin coating.

15. The method of claim 2, wherein the ratio of the thickness of the first passivation layer and the thickness of the second passivation layer is substantially at least two.

16. The method of claim 1, wherein the at least one void is filled up with the second passivation layer after forming the second passivation layer.

* * * * *